United States Patent
Li

(10) Patent No.: US 11,302,878 B2
(45) Date of Patent: Apr. 12, 2022

(54) ORGANIC LIGHT EMITTING DIODE DISPLAY PANEL AND METHOD OF FABRICATING SAME

(71) Applicant: WUHAN CHINA STAR OPTOELECTRONICS SEMICONDUCTOR DISPLAY TECHNOLOGY CO., LTD., Hubei (CN)

(72) Inventor: Zhao Li, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 392 days.

(21) Appl. No.: 16/483,892

(22) PCT Filed: May 17, 2019

(86) PCT No.: PCT/CN2019/087435
§ 371 (c)(1),
(2) Date: Aug. 6, 2019

(87) PCT Pub. No.: WO2020/191903
PCT Pub. Date: Oct. 1, 2020

(65) Prior Publication Data
US 2021/0359234 A1    Nov. 18, 2021

(30) Foreign Application Priority Data

Mar. 28, 2019   (CN) .......................... 201910242542.2

(51) Int. Cl.
*H01L 51/00* (2006.01)
*H01L 51/56* (2006.01)

(52) U.S. Cl.
CPC .......... *H01L 51/0097* (2013.01); *H01L 51/56* (2013.01); *H01L 2227/323* (2013.01); *H01L 2227/326* (2013.01); *H01L 2251/5338* (2013.01)

(58) Field of Classification Search
None
See application file for complete search history.

(56) References Cited

U.S. PATENT DOCUMENTS 8,059,328 B1    11/2011  Kuo
10,490,758 B2 *  11/2019  Xie ..................... H01L 51/0097
(Continued)

FOREIGN PATENT DOCUMENTS

CN       105789257 A    7/2016
CN       106601776 A    4/2017
(Continued)

*Primary Examiner* — J. E. Schoenholtz

(57) ABSTRACT

An organic light emitting diode (OLED) display panel and a method of fabricating the same are provided. The OLED display panel includes a double-layer polyimide flexible layer, a thin film transistor driving layer, an OLED light emitting layer, and a thin film encapsulation layer. The double-layer polyimide flexible layer includes a glass substrate, a wetting layer, a polyimide flexible layer, and an inorganic silicon nitride layer. The wetting layer converts the glass substrate or the inorganic silicon nitride layer from hydrophilic to hydrophobic.

16 Claims, 2 Drawing Sheets

(56) References Cited

U.S. PATENT DOCUMENTS

| | | | |
|---|---|---|---|
| 2003/0034497 A1* | 2/2003 | Yamazaki | H01L 27/326 257/86 |
| 2007/0066078 A1* | 3/2007 | Kugler | H01L 51/0004 438/716 |
| 2010/0265206 A1 | 10/2010 | Chen | |
| 2017/0162825 A1* | 6/2017 | Xiao | H01L 51/003 |
| 2017/0279080 A1 | 9/2017 | Wang et al. | |
| 2018/0294445 A1* | 10/2018 | Nakaie | H01L 51/56 |
| 2019/0131551 A1 | 5/2019 | Xie | |
| 2019/0348621 A1 | 11/2019 | Wojciechowski et al. | |
| 2020/0006685 A1 | 1/2020 | Xie | |
| 2020/0381639 A1* | 12/2020 | Wang | H01L 51/0097 |

FOREIGN PATENT DOCUMENTS

| | | |
|---|---|---|
| CN | 107680994 A | 2/2018 |
| CN | 109273511 A | 1/2019 |
| WO | 2018139945 A1 | 8/2018 |

* cited by examiner

ORGANIC LIGHT EMITTING DIODE DISPLAY PANEL AND METHOD OF FABRICATING SAME

FIELD OF INVENTION

The present disclosure relates to the field of display technologies, and more particularly to an organic light emitting diode (OLED) display panel and a method of fabricating the same.

BACKGROUND OF INVENTION

In recent years, the development of display technologies of organic light emitting diodes (OLEDs) have been advancing by leaps and bounds. OLED products have received more and more attention and applications due to their advantages of lightness, fast response, wide viewing angles, high contrast, and flexibility. The OLED products are mainly used in display fields such as mobile phones, tablets, and televisions.

OLEDs have received great attention from academies and industries because of their great potential in solid-state lighting and flat panel display. OLED panels can be made lighter and thinner, and therefore, flexible display technologies will be the future development trend. The commonly used base substrates are mostly flexible substrates such as polyimide (PI), and thin film transistors are controlled by signals on a flexible substrate to realize illumination control of OLED devices.

The flexible OLED display panel device includes a polyimide flexible layer, a thin film transistor driving layer, an OLED light emitting layer, a thin film encapsulation layer, and the like from bottom to top. The principle of OLED illumination is to deposit an OLED luminescent layer between two electrodes, to pass current to the OLED luminescent layer, and to cause luminescence by carrier injection and recombination. In flexible OLED display technologies, PI is often used in place of conventional glass substrates to achieve folding and flexible display. In order to achieve better bending and water-oxygen barrier properties, a double-layer PI is usually used instead of a single-layer PI, that is, a PI-SiNx-PI structure. Most of the preparation methods of the PI substrate in the industry are coating methods, that is, coating a certain thickness of PI solution on the glass substrate, and solvent is volatilized to form a PI hard film. Because the PI solution has opposite hydrophobicity to the glass substrate and inorganic SiNx, the PI solution is difficult to spread on the glass substrate and SiNx, and in particular, the edge region is likely to form an island-like effusion, thereby causing uneven thickness of the PI substrate, that is, the edge area of PI film is thick, which affects the product yield of the OLED display panel and has a risk of falling off when bent.

In the OLED display panel of the prior art, the PI solution is opposite to the hydrophilicity of the glass substrate and inorganic SiNx, resulting in a non-uniform thickness of the PI film of the flexible OLED display panel structure, which is easily broken and peeled off during bending.

SUMMARY OF INVENTION

To solve the above technical problems, an embodiment of the present disclosure provides an organic light emitting diode (OLED) display panel and a method of fabricating the same.

An embodiment of the present disclosure provides an organic light emitting diode (OLED) display panel. The OLED display panel includes a double-layer polyimide flexible layer, a thin film transistor driving layer, an OLED light emitting layer, and a thin film encapsulation layer. The double-layer polyimide flexible layer includes a first polyimide flexible layer, an inorganic silicon nitride layer, and a second polyimide flexible layer disposed in sequence. The double-layer polyimide flexible layer further includes a first wetting layer and a second wetting layer. The first polyimide flexible layer and the second polyimide flexible layer each have a thickness ranging between 5 microns and 15 microns. The thin film transistor driving layer is disposed on the double-layer polyimide flexible layer. The OLED light emitting layer is disposed on the thin film transistor driving layer. The thin film encapsulation layer is disposed on the OLED light emitting layer.

In an embodiment of the present disclosure, the first wetting layer is disposed on the first polyimide flexible layer.

In an embodiment of the present disclosure, the second wetting layer is disposed between the inorganic silicon nitride layer and the second polyimide flexible layer.

In an embodiment of the present disclosure, the first wetting layer, the first polyimide flexible layer, the inorganic silicon nitride layer, the second wetting layer, and the second polyimide flexible layer are disposed in sequence from top to bottom.

In an embodiment of the present disclosure, hydrophilicity of the inorganic silicon nitride layer is hydrophilic, hydrophilicities of the first polyimide flexible layer, the second polyimide flexible layer, the first wetting layer, and the second wetting layer are hydrophobic.

In an embodiment of the present disclosure, the second wetting layer contacts the inorganic silicon nitride layer to convert the inorganic silicon nitride layer from hydrophilic to hydrophobic.

In an embodiment of the present disclosure, materials of the first wetting layer and the second wetting layer include at least one of quaternary ammonium salt, sodium dodecyl sulfate, sodium dodecylbenzenesulfonate, polyvinyl alcohol, and polyvinyl chloride amphiphilic surfactant.

An embodiment of the present disclosure further provides an OLED display panel. The OLED display panel includes a double-layer polyimide flexible layer, a thin film transistor driving layer, an OLED light emitting layer, and a thin film encapsulation layer. The double-layer polyimide flexible layer includes a first polyimide flexible layer, an inorganic silicon nitride layer, and a second polyimide flexible layer disposed in sequence. The double-layer polyimide flexible layer further includes a first wetting layer and a second wetting layer. The thin film transistor driving layer is disposed on the double-layer polyimide flexible layer. The OLED light emitting layer is disposed on the thin film transistor driving layer. The thin film encapsulation layer is disposed on the OLED light emitting layer.

In an embodiment of the present disclosure, the first wetting layer is disposed on the first polyimide flexible layer.

In an embodiment of the present disclosure, the second wetting layer is disposed between the inorganic silicon nitride layer and the second polyimide flexible layer.

In an embodiment of the present disclosure, the first wetting layer, the first polyimide flexible layer, the inorganic silicon nitride layer, the second wetting layer, and the second polyimide flexible layer are disposed in sequence from top to bottom.

In an embodiment of the present disclosure, hydrophilicity of the inorganic silicon nitride layer is hydrophilic, hydrophilicities of the first polyimide flexible layer, the second polyimide flexible layer, the first wetting layer, and the second wetting layer are hydrophobic.

In an embodiment of the present disclosure, the second wetting layer contacts the inorganic silicon nitride layer to convert the inorganic silicon nitride layer from hydrophilic to hydrophobic.

In an embodiment of the present disclosure, materials of the first wetting layer and the second wetting layer include at least one of quaternary ammonium salt, sodium dodecyl sulfate, sodium dodecylbenzenesulfonate, polyvinyl alcohol, and polyvinyl chloride amphiphilic surfactant.

In an embodiment of the present disclosure, the inorganic silicon nitride layer has a thickness ranging between 0.5 microns and 2 microns, and the first polyimide flexible layer and the second polyimide flexible layer each have a thickness ranging between 5 microns and 15 microns.

An embodiment of the present disclosure further provides a method of fabricating an OLED display panel. The method includes Step S2, heating and curing a polyimide solution to form a first polyimide flexible layer, Step S3, forming an inorganic silicon nitride layer on the first polyimide flexible layer, Step S5, applying the polyimide solution onto the inorganic silicon nitride layer, and heating and curing the polyimide solution to form a second polyimide flexible layer on the inorganic silicon nitride layer, and Step S6, sequentially forming a thin film transistor driving layer, an OLED light emitting layer, and a thin film encapsulation layer on the second polyimide flexible layer processed by the step S5.

In an embodiment of the present disclosure, the method further includes Step S1, applying or spraying a wetting solution having a mass concentration of 0.01% to 1% onto a glass substrate to form a first wetting layer on the glass substrate, Step S4, coating or spraying the wetting solution having a mass concentration of 0.01% to 1% onto the inorganic silicon nitride layer to form a second wetting layer on the inorganic silicon nitride layer, and Step S7, peeling off the glass substrate. The step S2 further includes coating the polyimide solution onto the glass substrate after the step S4. The step S5 further includes coating the polyimide solution onto the inorganic silicon nitride layer after the step S4.

Beneficial effects of an embodiment of the present disclosure are that, the OLED display panel converts a glass substrate or an inorganic silicon nitride layer from hydrophilic to hydrophobic by providing a wetting layer, and then applies a hydrophobic PI solution to an interface of the hydrophobic wetting layer. Due to the same hydrophilicity and hydrophobicity, the PI solution can be effectively leveled on the glass substrate, and a PI film with uniform film thickness is formed after curing, thereby improving the film thickness uniformity of the PI film, improving the product yield of the OLED display panel, reducing the product yield, and reducing the risk of falling off during bending.

DETAILED DESCRIPTION OF PREFERRED EMBODIMENTS

Figure 1:
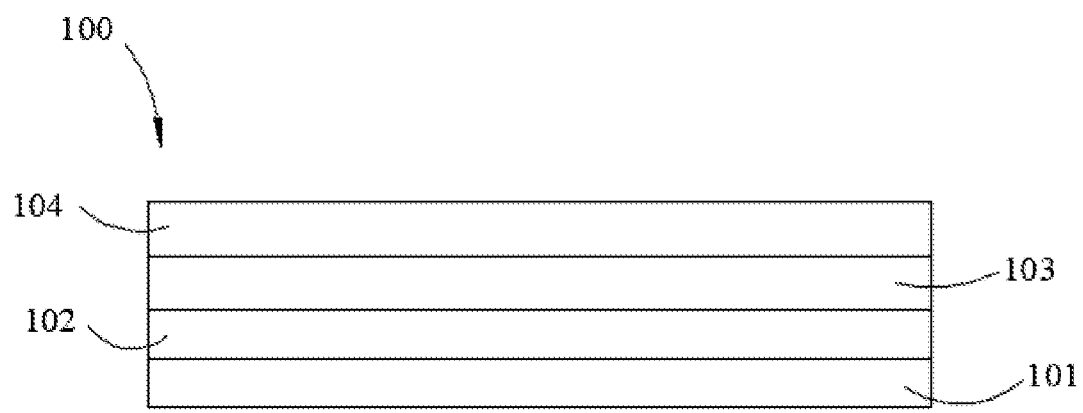
FIG. 1 is a schematic structural view of an organic light emitting diode (OLED) display panel according to an embodiment of the present disclosure.

The following description of each embodiment is with reference to the attached drawings and is provided to illustrate the specific embodiments.

In order to make the above and other objects, features, and advantages of the present disclosure more apparent and obvious, the preferred embodiments of the present disclosure will be hereinafter described, and in conjunction with the accompanying drawings. In addition, directional terms described by the present disclosure, such as up, down, top, bottom, front, back, left, right, inner, outer, side, surrounding, center, level, horizontal, vertical, longitudinal, axial, radial, uppermost, or lowermost, etc., are only directions by referring to the accompanying drawings, and thus the used terms are used only for the purpose of describing embodiments of the present disclosure and are not intended to be limiting of the present disclosure.

In the drawings, units with similar structures are labeled with the same reference number.

The embodiment of the present disclosure is directed to an organic light emitting diode (OLED) display panel of the prior art. In the prior art, because the polyimide (PI) solution has opposite hydrophobicity to the glass substrate and inorganic SiNx, the PI solution is difficult to spread on the glass substrate and SiNx, and in particular, the edge region is likely to form an island-like effusion, thereby causing uneven thickness of the PI substrate, that is, the edge area of PI film is thick, which affects the product yield of the OLED display panel and has a risk of falling off when bent. This embodiment can solve the drawbacks of the prior art.

FIG. 1 illustrates a structure of an OLED display panel 100 according to an embodiment of the present disclosure. The OLED display panel 100 includes a double-layer PI flexible layer 101, a thin film transistor driving layer 102, an OLED light emitting layer 103, and a thin film encapsulation layer 104. The double-layer PI flexible layer 101 is disposed on a bottom layer, and the thin film transistor driving layer 102 is formed on the double-layer PI flexible layer 101. The OLED light emitting layer 103 is disposed on the thin film transistor driving layer 102. Applying a current to the OLED light emitting layer 103 causes the OLED light emitting layer 103 to emit light by carrier injection and recombination. Finally, the thin film encapsulation layer 104 is prepared on the OLED light emitting layer 103 to package the OLED display panel 100.

In the OLED display panel 100 provided in this embodiment, a conventional glass substrate is replaced with PI to realize folding and flexible display. In order to achieve better bending and water-oxygen barrier properties, a double-layer PI is usually used instead of a single-layer PI, that is, a PI-SiNx-PI structure.

Figure 2:
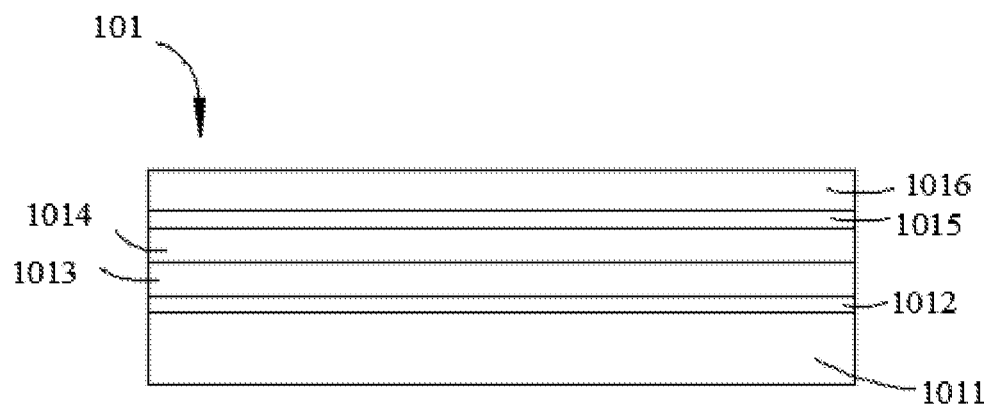
FIG. 2 is a schematic structural view of a double-layer polyimide (PI) flexible layer of an OLED display panel according to an embodiment of the present disclosure.

The structure of the double-layer PI flexible layer 101 in the OLED display panel 100 provided in this embodiment is as illustrated in FIG. 2. The double-layer PI flexible layer 101 includes a glass substrate 1011, a first wetting layer 1012, a first PI flexible layer 1013, an inorganic SiNx layer 1014, a second wetting layer 1015, and a second PI flexible layer 1016. Because the preparation method of the PI substrate is mostly a coating method, that is, a PI solution having a certain thickness is applied onto the substrate of the glass substrate 1011, and the solvent is heated and volatilized to form the first PI flexible layer 1013. Hydrophilicities of the glass substrate 1011 and the inorganic SiNx layer 1014 are hydrophilic, and hydrophilicities of the first PI flexible layer 1013 and the second PI flexible layer 1016 are hydrophobic. This embodiment provides a wetting layer, hydrophobicity of the wetting layer is hydrophobic. The first wetting layer 1012 converts the glass substrate 1011 from hydrophilic to hydrophobic, and the second wetting layer 1015 converts the inorganic SiNx layer 1014 from hydrophilic to hydrophobic, so that the PI solution can be better coated on the glass substrate 1011 and the inorganic SiNx layer 1014.

Materials of the first wetting layer 1012 and the second wetting layer 1015 include at least one of quaternary ammonium salt, sodium dodecyl sulfate, sodium dodecylbenzenesulfonate, polyvinyl alcohol, and polyvinyl chloride amphiphilic surfactan.

The structure of the double-layer PI flexible layer 101 in the OLED display panel 100 provided in this embodiment is as illustrated in FIG. 2. The wetting layer solution is prepared on the glass substrate 1011 by coating or spraying, and the solvent is removed by heating to form a first wetting layer 1012. A PI solution is then coated on the first wetting layer 1012 and the solvent is removed by heating to form a first PI flexible layer 1013. Then, an inorganic SiNx layer 1014 is prepared on the first PI flexible layer 1013 by chemical vapor deposition. After the inorganic SiNx layer 1014 is formed, a second wetting layer 1015 is formed on the inorganic SiNx layer 1014 by coating or spraying. Finally, a PI solution is coated on the second wetting layer 1015, and the solvent is removed by heating to form a second PI flexible layer 1016.

Figure 3:
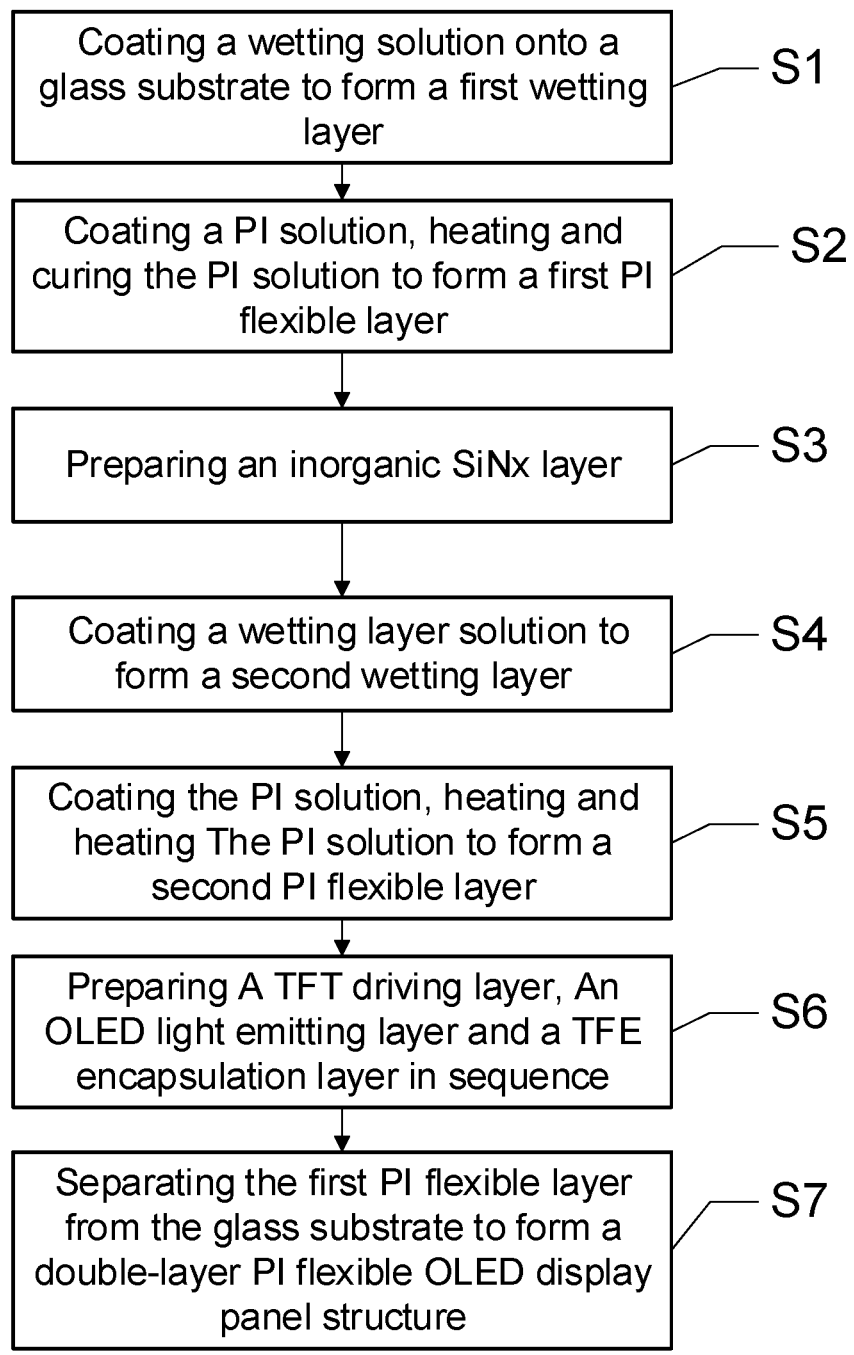
FIG. 3 is a schematic flowchart of a method of fabricating an OLED display panel according to an embodiment of the present disclosure.

As illustrated in FIG. 3, the embodiment further provides a method of fabricating an OLED display panel 100, including the following steps.

Step S1, coating or spraying a solution of wetting layer material having a mass concentration of 0.01% to 1% onto the glass substrate, and then removing the solvent by heating to form a first wetting layer on the glass substrate.

Step S2, applying the PI solution to the glass substrate after the process of the step S1, and heating and curing PI solution to form a first PI flexible layer having a thickness of 5 μm to 15 μm.

Step S3, preparing an inorganic SiNx layer on the first PI flexible layer by a chemical vapor deposition method, the inorganic SiNx layer having a thickness of 0.5 microns to 2 microns.

Step S4, coating or spraying a solution of the wetting layer material having a mass concentration of 0.01% to 1% onto the inorganic SiNx layer, and then removing the solvent by heating to form a second wetting layer.

Step S5, applying a PI solution to the inorganic SiNx layer after the process of the step S4, and heating and curing the PI solution to form a second PI flexible layer having a thickness of 5 μm to 15 μm.

Step S6, sequentially preparing a thin film transistor (TFT) driving layer, an OLED light emitting layer, and a thin film encapsulating layer on the second PI flexible layer after the process of the step S5.

Step S7, separating the first PI flexible layer from the glass substrate to obtain a double-layer PI flexible OLED display panel structure.

Although the present disclosure is described via one or more embodiments, those of ordinary skill in the art can come up with equivalent variations and modifications based upon the understanding of the specification and the accompanying drawings. The present disclosure includes all such modifications and variations and is only limited by the scope of the appended claims. In particular, as to the various functions performed by the components described above, the terms used to describe the components are intended to correspond to any component performing the specific functions (e.g., which are functionally equivalent) of the components (unless otherwise indicated), even those which are structurally different from the disclosed structure for performing the functions in the exemplary embodiments in the specification shown herein. In addition, although a particular feature in the specification is disclosed in only one of many embodiments, this feature may be combined with one or more features in other embodiments which are desirable and advantageous to a given or particular application. Moreover, the terms "include", "have", "consist of", or variations thereof used in the detailed description or the claims are intended to be used in a manner similar to the term "comprising".

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. An organic light emitting diode (OLED) display panel, comprising:
    a double-layer polyimide flexible layer comprising a first polyimide flexible layer, an inorganic silicon nitride layer, and a second polyimide flexible layer disposed in sequence, the double-layer polyimide flexible layer further comprising a first wetting layer and a second wetting layer, wherein the first polyimide flexible layer and the second polyimide flexible layer each have a thickness ranging between 5 microns and 15 microns;
    a thin film transistor driving layer disposed on the double-layer polyimide flexible layer;
    an OLED light emitting layer disposed on the thin film transistor driving layer; and
    a thin film encapsulation layer disposed on the OLED light emitting layer.

2. The OLED display panel according to claim 1, wherein the first wetting layer is disposed on the first polyimide flexible layer.

3. The OLED display panel according to claim 2, wherein the second wetting layer is disposed between the inorganic silicon nitride layer and the second polyimide flexible layer.

4. The OLED display panel according to claim 3, wherein the first wetting layer, the first polyimide flexible layer, the inorganic silicon nitride layer, the second wetting layer, and the second polyimide flexible layer are disposed in sequence from top to bottom.

5. The OLED display panel according to claim 3, wherein hydrophilicity of the inorganic silicon nitride layer is hydrophilic, hydrophilicities of the first polyimide flexible layer, the second polyimide flexible layer, the first wetting layer, and the second wetting layer are hydrophobic.

6. The OLED display panel according to claim 5, wherein the second wetting layer contacts the inorganic silicon nitride layer to convert the inorganic silicon nitride layer from hydrophilic to hydrophobic.

7. The OLED display panel according to claim 3, wherein materials of the first wetting layer and the second wetting layer comprise at least one of quaternary ammonium salt, sodium dodecyl sulfate, sodium dodecylbenzenesulfonate, polyvinyl alcohol, and polyvinyl chloride amphiphilic surfactant.

8. An OLED display panel, comprising:
   a double-layer polyimide flexible layer comprising a first polyimide flexible layer, an inorganic silicon nitride layer, and a second polyimide flexible layer disposed in sequence, the double-layer polyimide flexible layer further comprising a first wetting layer and a second wetting layer;
   a thin film transistor driving layer disposed on the double-layer polyimide flexible layer;
   an OLED light emitting layer disposed on the thin film transistor driving layer; and
   a thin film encapsulation layer disposed on the OLED light emitting layer.

9. The OLED display panel according to claim 8, wherein the first wetting layer is disposed on the first polyimide flexible layer.

10. The OLED display panel according to claim 9, wherein the second wetting layer is disposed between the inorganic silicon nitride layer and the second polyimide flexible layer.

11. The OLED display panel according to claim 10, wherein the first wetting layer, the first polyimide flexible layer, the inorganic silicon nitride layer, the second wetting layer, and the second polyimide flexible layer are disposed in sequence from top to bottom.

12. The OLED display panel according to claim 10, wherein hydrophilicity of the inorganic silicon nitride layer is hydrophilic, hydrophilicities of the first polyimide flexible layer, the second polyimide flexible layer, the first wetting layer, and the second wetting layer are hydrophobic.

13. The OLED display panel according to claim 12, wherein the second wetting layer contacts the inorganic silicon nitride layer to convert the inorganic silicon nitride layer from hydrophilic to hydrophobic.

14. The OLED display panel according to claim 10, wherein materials of the first wetting layer and the second wetting layer comprise at least one of quaternary ammonium salt, sodium dodecyl sulfate, sodium dodecylbenzenesulfonate, polyvinyl alcohol, and polyvinyl chloride amphiphilic surfactant.

15. The OLED display panel according to claim 8, wherein the inorganic silicon nitride layer has a thickness ranging between 0.5 microns and 2 microns, and the first polyimide flexible layer and the second polyimide flexible layer each have a thickness ranging between 5 microns and 15 microns.

16. A method of fabricating an OLED display panel, comprising:
   Step S1, applying or spraying a wetting solution having a mass concentration of 0.01% to 1% onto a glass substrate to form a first wetting layer on the glass substrate;
   Step S2, heating and curing a polyimide solution to form a first polyimide flexible layer;
   wherein the step S2 further comprises coating the polyimide solution onto the glass substrate after the step S4;
   Step S3, forming an inorganic silicon nitride layer on the first polyimide flexible layer;
   Step S4, coating or spraying the wetting solution having a mass concentration of 0.01% to 1% onto the inorganic silicon nitride layer to form a second wetting layer on the inorganic silicon nitride layer;
   Step S5, applying the polyimide solution onto the inorganic silicon nitride layer, and heating and curing the polyimide solution to form a second polyimide flexible layer on the inorganic silicon nitride layer; wherein the step S5 further comprises coating the polyimide solution onto the inorganic silicon nitride layer after the step S4;
   Step S6, sequentially forming a thin film transistor driving layer, an OLED light emitting layer, and a thin film encapsulation layer on the second polyimide flexible layer processed by the step S5; and
   Step S7, peeling off the glass substrate.

* * * * *